United States Patent
Nystrom et al.

(10) Patent No.: US 7,593,636 B2
(45) Date of Patent: Sep. 22, 2009

(54) PIN REFERENCED IMAGE SENSOR TO REDUCE TILT IN A CAMERA MODULE

(75) Inventors: Michael J. Nystrom, San Jose, CA (US); David B. Tuckerman, Lafayette, CA (US); Belgacem Haba, Saratoga, CA (US); Giles Humpston, Buckinghamshire (GB); Jesse Burl Thompson, Brentwood, CA (US)

(73) Assignee: Tessera, Inc., San Jose, CA (US)

( * ) Notice: Subject to any disclaimer, the term of this patent is extended or adjusted under 35 U.S.C. 154(b) by 83 days.

(21) Appl. No.: 12/004,149

(22) Filed: Dec. 20, 2007

(65) Prior Publication Data

US 2008/0191300 A1    Aug. 14, 2008

Related U.S. Application Data

(63) Continuation of application No. 11/701,177, filed on Feb. 1, 2007, now abandoned.

(51) Int. Cl.
*G03B 17/00* (2006.01)
(52) U.S. Cl. .............. 396/542; 396/541; 348/294; 348/374
(58) Field of Classification Search ............. 396/439, 396/541, 542; 348/294, 340, 374
See application file for complete search history.

(56) References Cited

U.S. PATENT DOCUMENTS

| | | | | |
|---|---|---|---|---|
| 4,581,657 A * | 4/1986 | Takano | ............. | 358/483 |
| 5,673,083 A * | 9/1997 | Izumi et al. | ............. | 348/340 |
| 6,853,005 B2 * | 2/2005 | Ikeda | ............. | 257/72 |
| 6,977,783 B2 * | 12/2005 | Lung | ............. | 359/819 |
| 2001/0012073 A1 * | 8/2001 | Toyoda et al. | ............. | 348/335 |
| 2002/0057468 A1 * | 5/2002 | Segawa et al. | ............. | 358/509 |
| 2005/0056769 A1 * | 3/2005 | Chen | ............. | 250/208.1 |
| 2005/0067681 A1 * | 3/2005 | De Villeneuve et al. | ............. | 257/678 |
| 2005/0078207 A1 * | 4/2005 | Minamio et al. | ............. | 348/340 |
| 2005/0270390 A1 * | 12/2005 | Hosokai | ............. | 348/294 |
| 2005/0275741 A1 * | 12/2005 | Watanabe et al. | ............. | 348/340 |
| 2005/0285973 A1 * | 12/2005 | Singh et al. | ............. | 348/374 |
| 2006/0181633 A1 * | 8/2006 | Seo | ............. | 348/340 |
| 2008/0285968 A1 * | 11/2008 | Chang et al. | ............. | 396/542 |

* cited by examiner

*Primary Examiner*—W B Perkey
*Assistant Examiner*—Warren K Fenwick
(74) *Attorney, Agent, or Firm*—Lerner, David, Littenberg, Krumholz & Mentlik, LLP

(57) ABSTRACT

The present invention relates to a camera module. The camera module includes a circuit panel having a top side, a bottom side and transparent region, the circuit panel having conductors. The module further includes sensor unit disposed on the bottom side of the circuit panel, and the sensor unit includes a semiconductor chip having a front surface including an imaging area facing in a forward direction in alignment with the transparent region and an imaging circuit adapted to generate signals representative of an optical image impinging on the imaging area. The module further includes posts protruding from the bottom side of the circuit panel, wherein at least some of the posts being engagement posts having bottom surfaces, and at least some of the bottom surfaces abutting an engagement surface of the sensor unit.

29 Claims, 9 Drawing Sheets

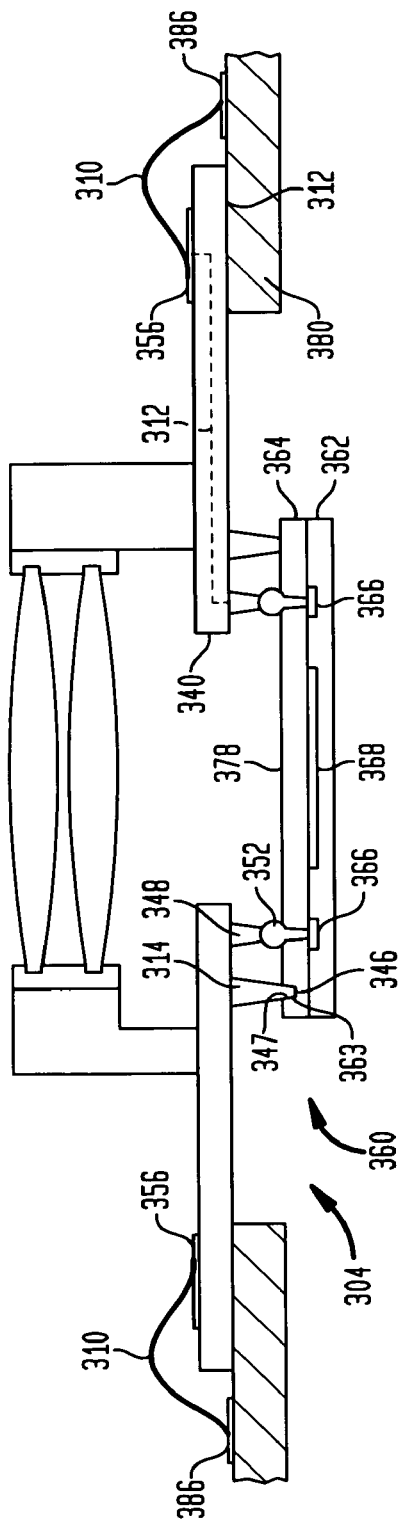
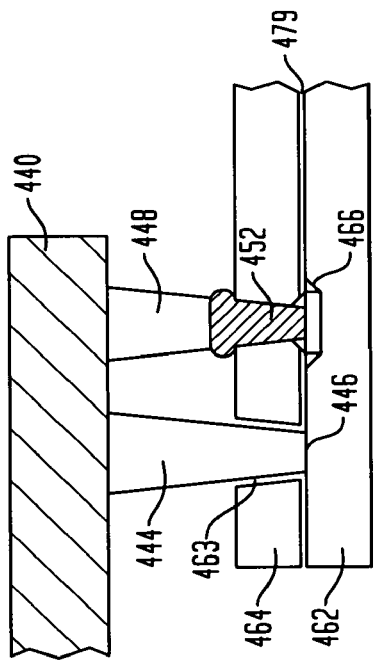

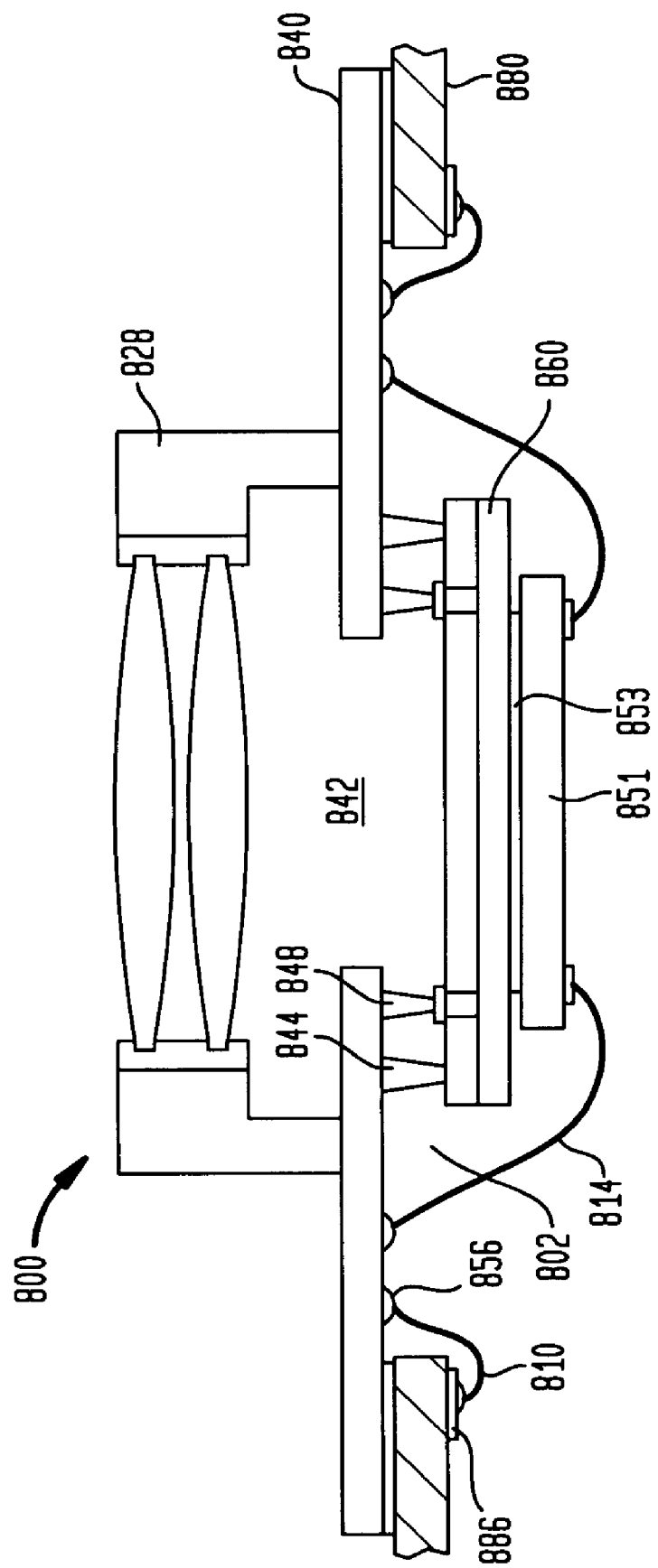

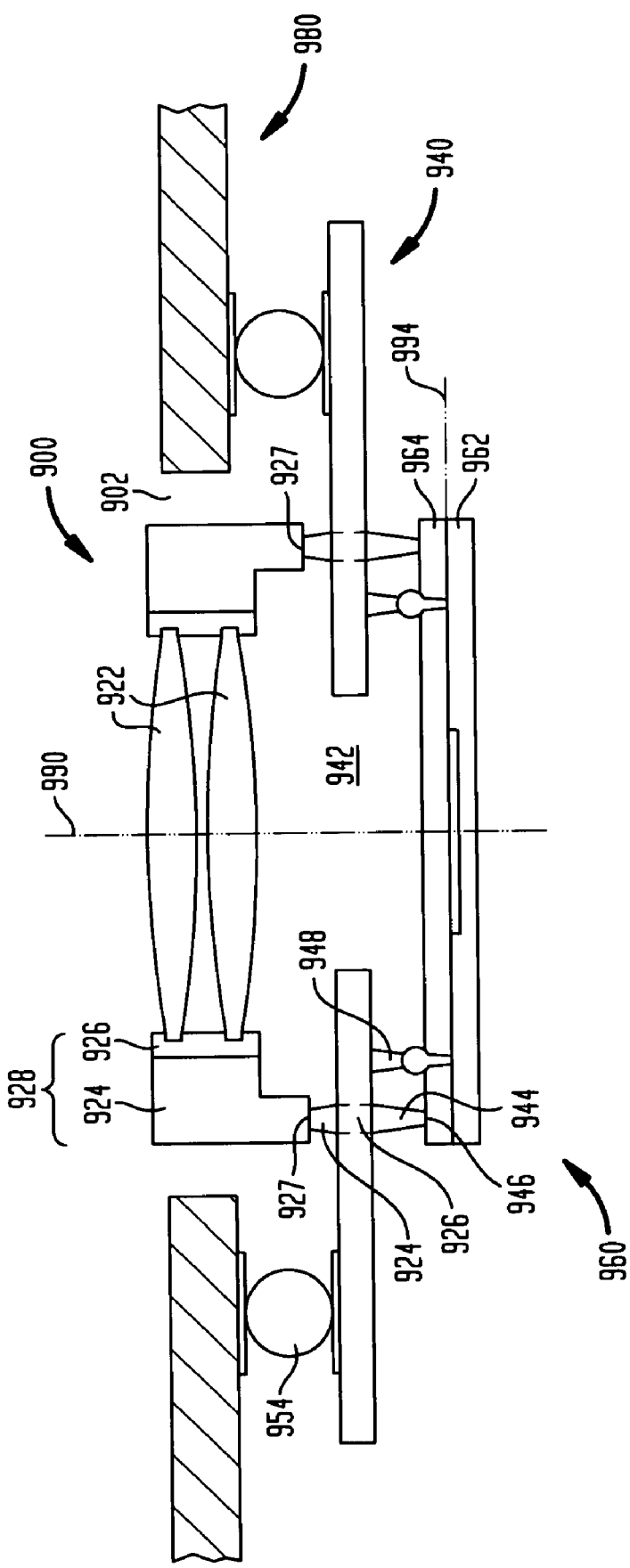

PIN REFERENCED IMAGE SENSOR TO REDUCE TILT IN A CAMERA MODULE

CROSS REFERENCE TO RELATED APPLICATIONS

The present application is a continuation of U.S. patent application Ser. No. 11/701,177, filed Feb. 1, 2007, the disclosure of which is incorporated by reference herein.

FIELD OF THE INVENTION

The present invention relates to the mounting and packaging of opto-electronic devices such as solid-state image sensors and lens assemblies therefor.

BACKGROUND OF THE INVENTION

Numerous electronic devices such as common electronic still cameras and video cameras include solid-state image sensors. A typical solid-state image sensor is formed in a semiconductor chip and includes an array of light-sensitive elements disposed in an area of the front surface of the chip, referred to herein as the "image sensing area." A color-sensitive image-sensing chip may include arrays of elements sensitive to different wavelengths of light. Each light-sensitive element is arranged to generate an electrical signal representing light falling on a particular small portion of the image sensing area. The semiconductor chip typically also includes internal electrical circuits arranged to convert these signals into a form intelligible to other elements of the device as, for example, into one or more streams of digital values representing the light falling on the various individual pixel areas.

Image sensing chips typically are used in conjunction with optical elements such as lenses which act to focus the image to be observed by the chip onto the active area, as well as wavelength-selective filters. The optical elements most commonly are mounted in a housing referred to as a "turret." Typically, both the turret and the chip are mounted, directly or indirectly, onto a supporting circuit panel, which supports and electrically interconnects various components of the device in addition to the image sensor. Many image sensor chips are supplied in packages which incorporate a dielectric enclosure surrounding the chip, with a transparent window overlying the image sensing area of the chip. The enclosure is provided with terminals, so that the enclosure can be mounted on a circuit board with the image sensing area and the overlying window facing upwardly away from the circuit board, and with the terminals connected to electrically conductive features of the circuit board. The turret can then be positioned over the package. These arrangements typically require a turret which occupies an area of the circuit board substantially larger than the area occupied by the chip package and substantially larger than the area occupied by the image-sensing chip itself. Stated another way, the area occupied by the turret in a plane parallel to the plane of the image sensing area is substantially larger than the area occupied by the image sensing chip and substantially larger than the area occupied by the package which holds the image sensing chip. This increases the size of the overall device. This problem is particularly acute in the case of very compact devices as, for example, cameras incorporated in cellular telephones and personal digital assistants ("PDAs").

Moreover, it is important to position the optical elements mounted in the turret accurately with respect to the image sensing area of the image-sensing chip. In particular, to achieve proper focusing of the image on the image sensing area of the chip, it is desirable to position the optical axis of the lenses and other optical elements in the turret precisely perpendicular to the plane of the image sensing area, and to place the lenses at a desired height above the image sensing area. The need for such precise positioning complicates the design of the assembly and, in some cases, may further aggravate the turret size problem noted above.

Another approach which has been suggested is to mount a bare or unpackaged image-sensing chip directly to a turret. In such an arrangement, it would theoretically be possible to achieve good positioning of the chip relative to the optical elements in the turret. However, image-sensing chips are susceptible to mechanical damage and to chemical attack by atmospheric contaminants. Thus, the turret in such an arrangement typically must include arrangements for holding the bare chip in a sealed environment. Moreover, bare imaging sensing chips are extremely sensitive to particulate contamination. As discussed above, each optically-sensitive element provides an electrical signal representing the light falling in a small element of the image, commonly referred to as a picture element or "pixel." If a particle lands on a particular optically sensitive element, it will block light directed onto that element, so that the resulting signals will show the pixel as dark. When the image is reconstructed from the signals, it will have a dark spot at the affected pixel. Any process which requires assembly of a bare chip with a turret must be conducted under stringent conditions to minimize particulate contamination. Moreover, such processes often suffer from high defect rates caused by particulate contamination. Both of these factors tend to increase the cost of the resulting assemblies. Moreover, these assemblies as well typically require turrets having areas substantially larger than the area of the chip itself.

Thus, there are substantial needs for improved opto-electronic assemblies and assembly methods.

SUMMARY OF THE INVENTION

One aspect of the present invention includes a camera module. Preferably the camera module includes a circuit panel having a top side, a bottom side and transparent region, the circuit panel having conductors. In addition, the camera module further includes a sensor unit disposed on the bottom side of the circuit panel, the sensor unit including a semiconductor chip having a front surface including an imaging area facing in a forward direction in alignment with the transparent region and an imaging circuit adapted to generate signals representative of an optical image impinging on said imaging area. Posts protruding from the bottom side of the circuit panel are also provided, at least some of said posts being engagement posts having bottom engagement surfaces. Preferably, at least some of the bottom engagement surfaces abut an engagement surface of the sensor unit.

BRIEF DESCRIPTION OF THE DRAWINGS

These and other features, aspects and advantages of the present invention will become better understood with regard to the following description, appended claims and accompanying drawings were:

FIG. 3 is a sectional view according to a third embodiment of the present invention;

FIG. 4 shows a close-up view of a variant of the area IC1 of FIG. 3;

FIG. 8 is a sectional view according to a fourth embodiment of the present invention;

FIG. 9 is a sectional view according to a fifth embodiment of the present invention;

It should be noted that the dimensions of the assemblies shown in the Figures may be distorted for clarity of the illustration, and different proportions of the different dimensions are also possible, and like numbers represent similar elements.

DETAILED DESCRIPTION

Figure 1:
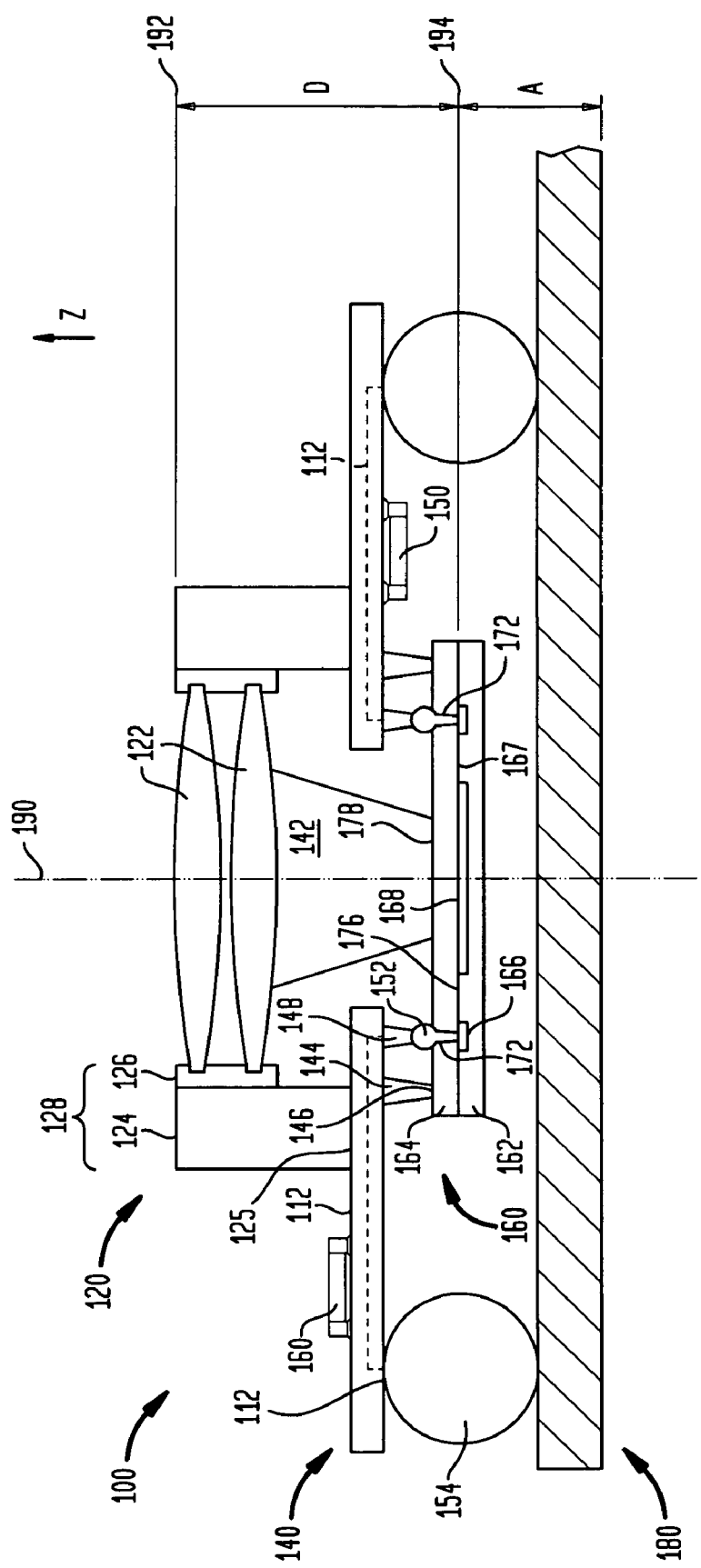
FIG. 1 is a sectional view according to a first embodiment of the present invention.

A module in accordance with a first embodiment of the present invention, illustrated in FIG. 1, includes a camera unit 100 with an optical unit 120, a circuit panel 140 and a sensor unit 160. The sensor unit 160 has an upper or top surface 178. As used in this disclosure, terms such as "upwardly," "upper," "top," "downwardly," "lower," "bottom," "vertically," and "horizontally" should be understood as referring to the frame of reference of the element specified and need not conform to the normal gravitation frame of reference. In FIG. 1, the upward direction is the direction towards the top of the drawing. The FIG. 1 is for representative purposes only.

Sensor unit 160 preferably includes a semiconductor chip 162 and a cover 164. The chip 162 can be an electronic image sensor, with a front or top surface 167, with electronic circuits for generating one or more electrical signals representing an optical image impinging on image sensing are 168. Numerous electrical circuits are well known in the imaging art for this purpose. For example, the semiconductor chip 162 may be a generally conventional charge-coupled device (CCD) imaging chip with conventional circuits such as clocking and charge-to-voltage conversion circuits, or can also by an array of photodiodes such as a CMOS image sensor device. Any other conventional circuit may be used. Chip 162 has electrical connections or contacts 166 exposed at front surface 167, that allow electrical connection for signals and power supply of the chip 162 to an external device, such as a wiring board, circuit panel or substrate.

The sensor unit 160 also includes a cover 164 having an inner or bottom surface 176 and an outer or top surface 178. The cover overlies the front surface 167 of semiconductor chip 162, with the outer surface 178 facing upwardly away from the front surface. Cover 164 is physically attached to chip 162 and sealed to the chip by a sealant or bond material. At least that region of the cover 164 which overlies the image sensing area 168 is substantially transparent to light in the range of wavelengths to be imaged by the image sensing area 168. In the particular embodiment illustrated, cover 164 is a unitary slab of a transparent material such as a glass or polymeric material, so that the entirety of the cover is transparent to light.

In the embodiment shown in FIG. 1, holes 172 are arranged in the cover 164 so as to provide access to the contact pads 166 for electrical interconnection. The holes 172 are arranged in an area above the contact pads 166. The holes are filled with a conductive material which forms contacts 152 exposed at the outer surface of the cover.

Circuit panel 140 provides the function of an electrical interconnection and mounting element between the optical unit 120 and the sensor unit 160, and further interconnects with an external connection panel 180, for example a printed circuit board. The optical unit 120 including lenses 122 defines an optical path 190, and the circuit panel 140 mechanically holds sensor unit 160 so that the upper surface 176 of the chip 162 perpendicular to the optical path 190. In addition, the circuit panel 140 provides electrical interconnection between the sensor unit 160 and the external connection panel 180. Additional active and passive electronic elements 150 are arranged on at least the top or the bottom portion of the circuit panel 140, such as decoupling capacitors and power control circuits. As indicated by broken lines in FIG. 1, traces 112 may interconnect connection posts 148 with electronic components 150. The electronic elements 150 could further include signal processing means such as a digital signal processor (DSP and memory elements, that can be used to process and store signals read out from the semiconductor chip 162, before passing them to the external connection panel 180.

For electrical interconnection of the sensor unit 160 with external devices, for example a substrate, wiring board, etc. the electrical connection posts 148 are connected to traces 112 of the circuit panel 140. At least some traces lead to the connection portions 154 which may be solder balls. The connection portions 154 are the elements that can electrically and mechanically connect the camera unit 100 to an external device, such as a wiring board, substrate, etc. The connection portions 154 are big enough to exceed the height of the engaging posts 144 and the sensor unit 160 together, so as to contact an external connection panel 180 when the camera unit 100 is placed on top of it.

Circuit panel 140 is located between the optical unit 120 and the sensor unit 160, and an opening 142 is arranged in the circuit panel 140, so as to let light passed through the lenses 122 of the turret enter the sensor unit 160 and impinge on the image sensing area 168.

The circuit panel 140 includes projecting rear engagement posts 144 and electrical connection posts 148. The posts 144, 148 are of frustoconical shape, with a diameter that decreases towards the bottom. The size of the posts is exaggerated in the drawings for clarity of illustration. Although the posts may be of any size, in typical embodiments the posts are about 50-500 μm high and have diameters of about 50-300 μm. These posts are arranged around the opening 142, and have the function of interconnecting the sensor unit 160 with the circuit panel 140 electrically and mechanically. For this purpose, the rear engagement posts 144 have bottom surfaces 146 which are coplanar with one another and which define a planar engagement surface disposed below the circuit panel 140. Engagement posts 144 and electrical connection posts 148 can be both made of the same material, or alternatively they are made from different material, but at least the electrical connection posts 148 are made of electrically conductive material. Since the posts 144 and 148 will define the positioning of the sensor unit 160, it is important that the engagement posts are manufactured very uniformly, and in particular, the height of the engagement posts is within a small tolerance. For example, the posts 144 and 148 can be formed by etching a unitary starting structure including one or more metallic sheets. Processes for forming posts in conjunction with other elements of a circuit panel are shown, for example, in U.S. Pat. Nos. 6,782,610 and 6,826,827; U.S. Published Patent Application Nos. 20050116326A1 and 20050284658; as well as in U.S. Provisional Patent Application No. 60/847,504, the disclosures of which are all incorporated by reference herein.

Bottom surfaces 146 abut the upper surface 178 of the cover 164. The upper surface 178 and the image sensing area 168 are thereby maintained perpendicular to the optical axis 190 of the optical unit 120. The arrangement of the rear engagement posts 144 together with the circuit panel 140 and the sensor unit 160 ensures precise mechanical positioning between the upper surface 178 of the cover 164 and the optical axis 190, that will not vary during the connection of the sensor unit 160 to the electrical connection posts 148, for example during a reflow soldering process. Stated another way, in the embodiment shown in FIG. 1, engagement posts 144 preferentially have the function of holding the sensor unit 160 at a defined location on the Z-axis, the Z-axis being parallel to the optical axis 190 and pointing towards the top in FIG. 1.

As explained above, the circuit panel is also equipped with electrical connection posts 148 that project downwardly towards the sensor unit 160, but in this variant are shorter than the engagement posts 144, so as not to interfere with the mechanical positioning of the sensor unit 160 by the engagement posts 144. The electrical connection posts 148 can be arranged in the vicinity of the posts 144, and can be formed during the same manufacturing step of the circuit panel 140. The connection posts 148 are located to match the position of the respective contacts 152 of the sensor unit in the XY-plane transverse to optical axis 190. The electrical connection posts 148 are connected to the contacts 152 on the top surface of sensor unit 160. For example, an electrically conductive adhesive can be used to bond connection posts 148 to the contacts 152 of the sensor unit. Alternatively, the connection posts 148 may be solder-bonded to the contacts 152 of the sensor unit. For example, where contacts 152 are formed by solder masses in holes 172, the solder masses may be bonded directly to connection posts 148.

The conductive bonding process should not interfere with engagement between the engagement posts 144 and the surface of the sensor unit. For example, the sensor unit can be held in abutment with the engagement pins while the conductive adhesive is cured or during solder reflow. An additional adhesive (not shown) can be applied at the engagement posts. Before the bonding process, the sensor unit 160 is positioned into the correct X-Y position, so that the contacts 152 are in contact with the corresponding connection posts 148, and so that the center of the imaging area of the sensor unit is aligned with the optical axis 190. For this purpose, a fixture (not shown) can be used that will hold the sensor unit 160 in position during soldering or adhesive bonding. In a solder-bonding operation, the surface tension of the molten solder on the connection posts 148 can help to pull the sensor unit 160 upwards towards the circuit panel 140, and into abutment with engagement posts 144. Another way of connecting the engagement posts 144 to the contacts 152 is by diffusion bonding.

The optical unit 120 including the turret 128 is located on top of the circuit panel 140. In the particular embodiment depicted, the turret 128 includes both an outer shell 124 and an inner barrel 126 mounted to the outer shell 124. The optical unit 120 further includes optical elements such as lenses 122 mounted to the inner barrel 126 of the turret, and can also include filters such as one or more wavelength-selective filters (not shown), also mounted within barrel 126. The optical elements, and particularly lenses 122, are arranged along the optical axis 190, and are arranged to focus an image onto a plane defined by the image sensing area 168, being perpendicular to this axis.

Barrel 126 is mounted for adjustment in upward and downward directions along the optical axis 190. The barrel and outer shell 124 may be provided with elements such as screw threads or cam surfaces for controlling the position of the barrel, and hence of the optical elements, relative to the outer shell in the direction along axis 190. Alternatively, the barrel 126 and shell 124 may be arranged so that the barrel is slideable in the axial direction relative to the outer shell 124, and so that the barrel can be fixed in position relative to the outer shell once it has been adjusted to a desired position as, for example, by applying a small ultrasonic or solvent weld between these elements, or by applying an adhesive to fix the barrel in position relative to the shell. In another variant the barrel 126 and the shell 124 are formed by an integral turret element and therefore the focal plane cannot be adjusted. The shell 124 of turret 128 has a main surface 125 facing downwardly or rearwardly. This surface 125 is in connection with the circuit panel 140, and is perpendicular to the optical axis 190 to within a closely controlled tolerance. Main surface 125 desirably overlies that portion of the circuit panel 140 carrying engagement posts 140.

The distance D in direction of the optical axis 190 between the lenses 122 and the sensing are 168 is a constant for a given optical design, such as a given configuration of lenses. The circuit panel 140 is arranged within this distance D, and therefore the height of panel 140 does not add to the overall height of the sensor unit. In addition, the connection elements 154 are arranged on a lower surface of the circuit panel 140, between a side wall of the sensor unit 160 and an outer edge of the circuit panel 140, and are therefore arranged partially within the distance D. The portions of the of the connection elements 154 and the external connection board 180, that are outside the distance D, only add a distance A (FIG. 1) to the distance D.

Therefore, a lower surface of the sensor unit 160 can be close to an upper surface of the external connection board 180. In an alternative version, the lower surface of the sensor unit 160 is in contact with the upper surface of the external connection board 180, or a thermal conduction element can be in contact with the external connection board 180. Such a feature can allow good thermal contact with the external connection board 180 for heat conduction from the semiconductor chip 162.

The turret 128 or at least the shell 124 of the turret 128 of the optical unit 120 can be manufactured by molding it directly onto the circuit panel 140. In the molding step, any imperfections of the planarity of the circuit panel 140 can be compensated for. In such manufacturing step, the circuit panel 140 is placed into the mold and the turret 128 is molded to the panel, resulting in a mechanical bond between turret 128 and the circuit panel 140 The material used for the molding to form the turret 128 can be an epoxy-based material. The molding form can be positioned onto the circuit panel by using the engagement posts 144 or the electrical connection posts 148 as a reference position. In another alternative, first the turret 128 is prefabricated, and in a later step, the turret 128 is positioned on an appropriate location onto the circuit panel 140, and then attach the turret with an adhesive or glue to the panel 140 by a pick-and-place manufacturing process.

Figure 2:
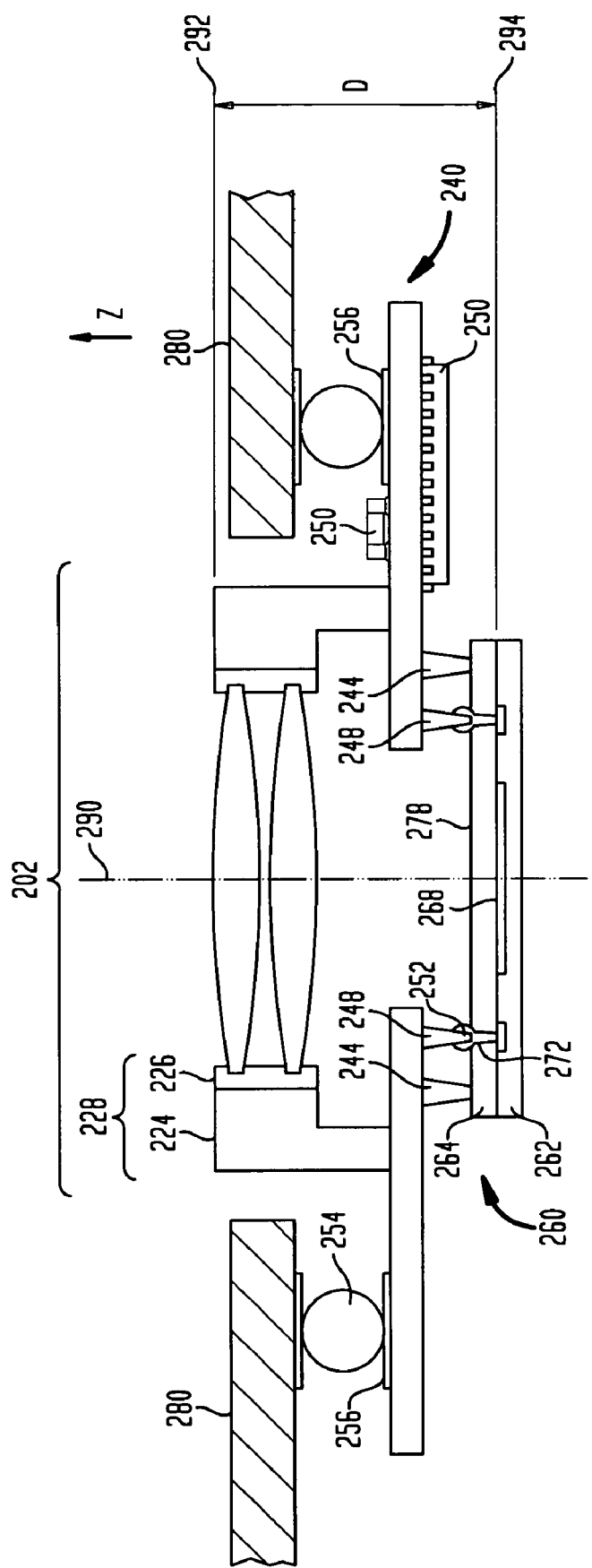
FIG. 2 is a sectional view according to a second embodiment of the present invention.

In a second embodiment of the present invention as shown in FIG. 2, the overall height in direction of the Z-axis is further minimized, as compared to the first embodiment shown in FIG. 1. In this embodiment, the connection elements 254, shown as solder bumps in FIG. 2, are arranged on connection pads 256 that are located on the top surface of the circuit panel 240. The external or main circuit panel 280 is therefore arranged above the circuit panel 240. A hole 202 is formed in the external or main circuit panel 280. Hole 202 is big enough to surround turret 228. In the embodiment shown in FIG. 2, the external or main circuit panel 280, the connection elements 254, and the circuit panel 240 are all arranged within the optical distance D, and do not add to the overall height of the camera unit 200. In this variant shown, the engagement posts 244 and the connection posts and 248 have substantially the same length, and are also formed from the same metal layer. While engagement posts abut against the upper surface 278 of the cover 264, connection posts point towards holes 272 of the cover. The holes 272 are filled with solder 252 that electrically connect with the connection posts 248 to the semiconductor chip 262.

Preferably, passive and active electronic components 250 are arranged on a lower side of the circuit panel 240 so that they do not interfere with the external or main circuit panel 280. However, the external components 250 can be arranged on both sides of the circuit panel 240. In a variant, main panel 280 may be mechanically connected to the turret 228. For example, a liquid encapsulant that can be hardened may be filled in the empty spaces between the circuit panel 240, the turret 228 and the external connection panel 280. After hardening, such a encapsulant would increase adhesion and would strengthen the mechanical interconnection of these elements. In order to improve evacuation of heat from the sensor unit 260, another mechanical element can be arranged on the bottom face of the semiconductor chip 262, for example a heat sink.

In a further embodiment (FIG. 3), camera unit 300 is placed onto an external or main circuit panel 380 that has an opening 304 formed therein. The opening 304 is wider than the sensor unit 360. An upper surface of the main circuit panel 380 is mechanically connected with a lower surface of the circuit panel 340, as for example by solder 312 or by an adhesive. Pads 356 and 386 are arranged on the wiring panel 340 and on main circuit panel 380, respectively. Pads 356 are electrically connected to connection posts 348 by traces 312 of panel 340. Pads 356 and 380 can be electrically connected together by wire bonds 310. The wires 310 can be protected by an encapsulant (not shown). In a further variant, wiring panel 340 is mounted on a lower side of the external or main connection panel 380. In the embodiment shown in FIG. 3, the wire bond 310 is located on an upper side of the panels 340, 380, but the wire bond 310 can also be arranged on the lower side.

As also shown in FIG. 3, the cover 364 of sensor unit 360 has recesses 363. The recesses 363 accommodate the engagement posts 344. Such recesses can be formed by drilling holes into the cover 364, or by etching out some material of the cover 364. The recesses 363 are shaped frustoconically, the sidewalls being slanted. The shape of the recess 363 is complementary to the shape of the corresponding engagement posts 344 that will enter the recess 363, and the width of the recess is chosen that the lower surface 364 of the engagement post 344 will still contact the bottom surface of the recess 363. The tapered side surfaces 347 of the posts face in lateral or X-Y direction (to the left and right in FIG. 3). These laterally-facing surfaces of the posts contact laterally-facing side surfaces of recesses 363. The recesses 363 and engagement posts 344 thereby provide alignment of the sensor unit 360 relative to control the circuit panel 340, and relative to the optical axis in the X and Y directions perpendicular to the optical axis, as well as in the Z direction along the optical axis.

In a further variant, engagement posts 344 may have two different lengths, wherein the shorter engagement posts will abut the top surface 378 of the cover 364, and the longer posts will engage into corresponding recesses 363 on the cover 364.

FIG. 4 depicts another variant. In this variant, engagement posts 444 extend entirely through the cover 464. For this purpose, each recess 463 in the cover 464 is a bore or hole that extends through cover 464. The lower surface 446 of the engagement post 444 thereby engages with a top surface of the semiconductor chip 462. In this arrangement, a tilt error influencing the angle between the optical axis and the image sensing area 468, caused by tilt of cover 464 relative to chip 462, is avoided. In this embodiment as well, laterally-facing surfaces of the posts engage laterally-facing surfaces of the recesses in the cover to control lateral or X-Y positioning of the sensor unit.

Figure 5:
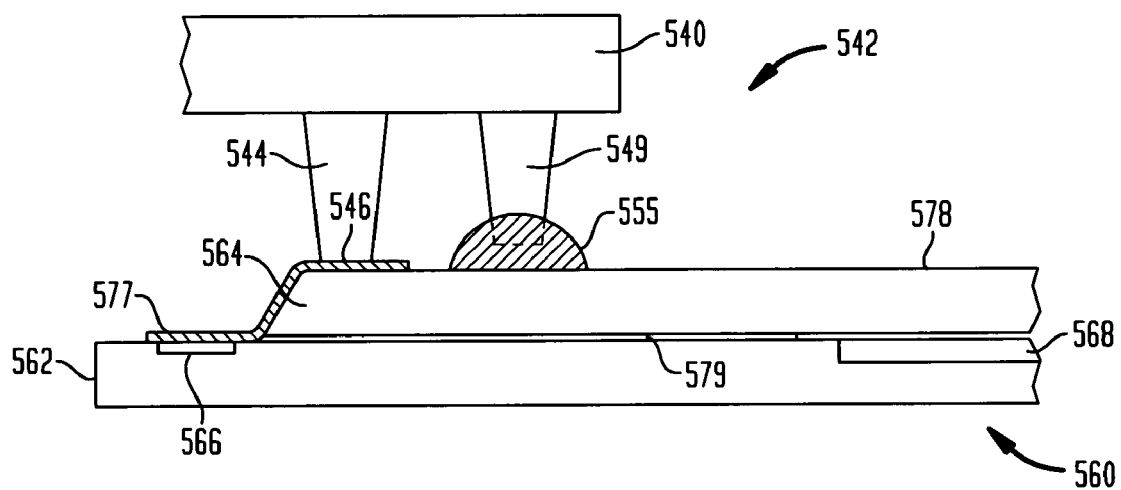
FIG. 5 shows a different embodiment of the close-up view of the area IC1 of FIG. 3.

Another embodiment of the connection between the circuit panel 540 and the sensor unit 560 are shown in FIG. 5. In this embodiment the mechanical engagement posts 544 also have the function of electrically connecting the semiconductor chip 562 to the circuit panel 540. For this purpose, wiring traces 577 are formed onto the chip 562 and the cover 564. Traces 577 are connected to the chip pads 566, and lead to an upper surface of the cover 564. All the traces 577 that are used to connect to the posts 544 desirably have substantially the same thickness, so that their upper surfaces are co-planar with each other. In this embodiment, the surfaces of traces 577 constitute the engagement surface of the sensor unit. Here again, all of the bottom surfaces 546 of the engagement posts desirably have the same location on a Z-axis, and therefore, are co-planar with each other.

The embodiment of FIG. 5 also includes additional posts 549 that are arranged for mechanical purposes. While posts 544 are arranged close to the outer edge of the cover 564, the posts 549 are arranged closer to the opening 542. Posts 549 further improve the mechanical connection of the sensor unit 560 to the circuit panel 540. In this embodiment, the posts 549 are shorter than the posts 544, and an adhesive 555 is arranged around the lower portion of posts 544, and at the interface area between posts 544 and cover 564. The adhesive 555 may be epoxy that was in a liquid state and is uncured during assembly. The posts 544 are preferentially soldered to the traces 577 by a reflow soldering process. The connection area around the lower surfaces 546 of the engagement posts 544 can also be filled with an adhesive material, as shown for posts 548. The cover 564 does not extend to the outer edge of the chip 562, and the edge of the cover is slanted. This avoids sharp edges that would also cause sharp bends in the traces 577. It is also possible that the cover 564 extends to the outer edges of the chip 562, and that recesses are formed at the locations of the pads 566, to provide traces that lead to the upper surface 578 of the cover.

As can be seen in FIG. 5, the adhesive 579 provides a seal and also acts as a support structure to hold the cover 564 above the chip 562. The adhesive is disposed near the edges of the chip, but is not disposed above the image sensing area 568 to avoid impeding or distorting light entering onto the photosensitive portions of the image area 568. Thus, there is a gap between cover 564 and chip 562 aligned with sensing area 568. The engagement posts 544 are located in an area aligned with the support structure or adhesive sealing material 579.

Figure 6A:
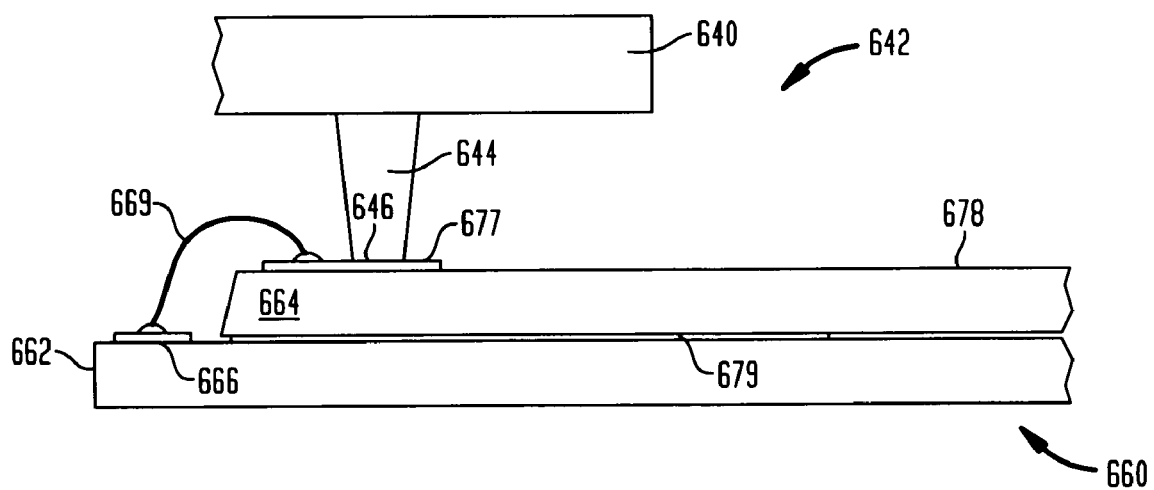
FIGS. 6A-B show additional embodiments of the close-up view of the area IC1 of FIG. 3.
Figure 6B:
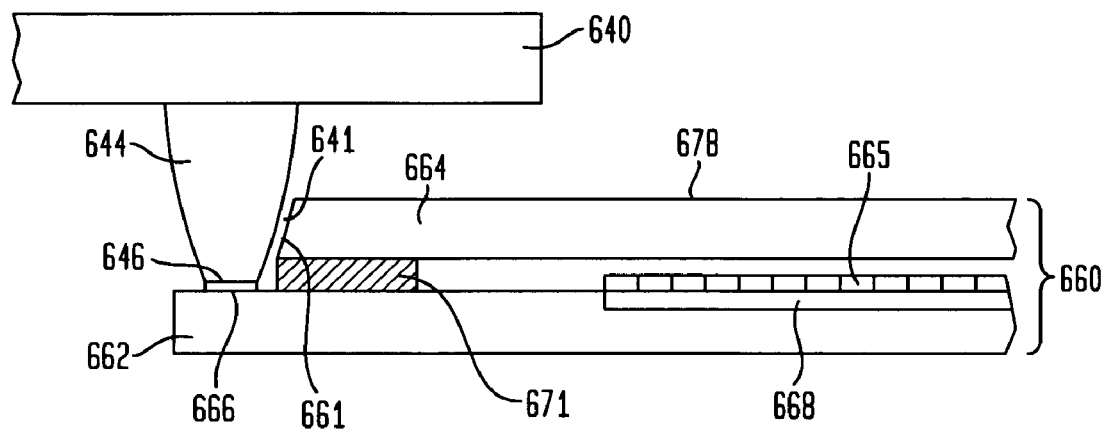

In the embodiments shown in FIGS. 6a-b, there are no additional posts other than the engagement posts 644. In the variant shown in FIG. 6a, traces 677 are formed on the cover 664, but do not directly contact the pads 666 of the chip. Connection pads 666 are not covered by the cover 664. Wire bonds extend from the pads 666 towards pad areas being portions of the traces 677. To protect the electrical connection formed by the bonding wire 669, the wire can be enclosed by an encapsulant (not shown).

In the variant shown in FIG. 6b, contacts 666 of chip 662 serve as the engagement surface of the sensor unit, and also serve as electrical connections. The cover overlies the portion of the semiconductor chip 662 where the image sensing area 668 is arranged, but does not cover the areas where the posts 644 are arranged. A microelectronic device in which the chip projects beyond the cover is shown, for example, in U.S. Provisional Patent Application No. 60/761,171, the disclosure of which is incorporated by reference herein. In the variant shown, the posts 644 have the function of defining perpendicularity of the focal plane to the optical axis, the X-Y positioning of the sensor unit 660 towards the optical axis, and the electrical interconnection of the sensor unit 660 with the circuit panel 640.

Sensor unit 660 includes a chip 662 and the image sensing area 668 is covered by a transparent cover 664. In this variant, microfilters 665 are arranged on top of the image sensing area 668, in the gap between the chip 662 and the cover 664. The cover 664 is supported at a predetermined spacing from the image sensing area by a support structure 671. In this embodiment, support structure 671 includes a solid wall bonded to chip 662 and to cover 664. Bond pads 666 of the chip 662 are exposed beyond edges of the support structure 671 to permit conductive interconnection with connection posts 644. For X-Y alignment, posts 644 have side surfaces 641 facing in lateral or X-Y directions transverse to the forward direction, being the Z-direction, at least one of the side surfaces 641 abuts at least on laterally-facing edge surface 661 of the cover 664. The lower surfaces 646 of the engagement posts 644 abut contacts 666 of the semiconductor chip 662 which serve as the engagement surface of the chip and also provide electrical connections.

The cover 664 may overlie only an interior portion of the chip 662 that is set back from each of the edges of the chip 662, and bond pads 666 may be adjacent to all four edges of the chip 662 that are thus exposed. In a variant, bond pads 666 are present and exposed only along some edges of the chip 662. For example contacts 666 may be exposed only along two opposing edges of the chip, with no contacts exposed along other edges.

Figure 7:
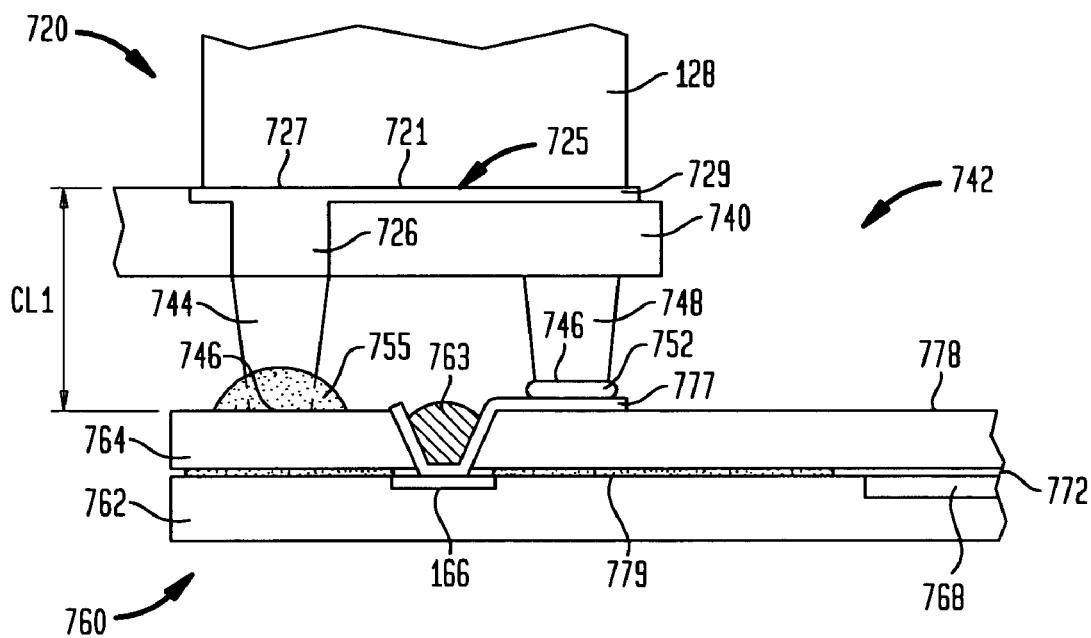
FIG. 7 shows another embodiment of the close-up view of the area IC1 of FIG. 3.

In a further embodiment depicted in FIG. 7, engagement posts 744 have top surfaces 727 exposed at the top surface of circuit panel 740. In this embodiment, the engagement posts 744 are formed as a unitary metallic structure including a plurality of engagement posts and also including a top plate 729 overlying the top surface of panel 740. The top plate defines the top surfaces 727 of the engagement posts, and also extends between the engagement posts to provide a unitary bearing surface 721 between the engagement posts. In this embodiment, the bearing surface 721 is coplanar with the top surfaces 727 of the engagement posts 744. The top surfaces 727 of the engagement posts, and the bearing surface 721 are exposed at the top surface of panel 740, so that the optical unit 760 can bear directly on the top surfaces of the posts and on the remainder of the unitary bearing surface. The height or distance CL1 between the top surfaces 727 of the engagement posts and the bottom surfaces 746 can be controlled precisely. For example, all of the engagement posts and the top plate can be formed from a metallic plate including a single metal layer or a plurality of metal layers, by etching the plate to remove metal except where the posts are to be formed, so as to form all of the posts with a height equal to the thickness of the plate.

The optical unit 720 including turret 728 has a bearing surface 725 which abuts the top surfaces 727 of the posts and the bearing surface 721. Here again, the bottom surfaces 746 of the posts 744 abut the engagement surface 778 of the sensor unit. The location of the optical unit in the Z-direction along the optical axis and the orientation of the optical axis relative to the image plane of the sensor unit 760, are determined entirely by the engagement posts 744. Because the engagement posts have precise and uniform heights, the optical unit is precisely positioned, with the optical axis precisely perpendicular to the imaging plane of the sensor unit 760, regardless of non-planarity and variations in the thickness of circuit panel 740.

In this embodiment, the top plate 729 provides additional reinforcement to the structure. The top plate connects the posts to one another electrically as well as structurally, for example by element 726. Such an electrical connection is acceptable where, as in this embodiment, the engagement posts 744 do not provide electrical connections to the sensor unit. In a variant, the engagement posts 744 may provide a common electrical connection, such as a ground or power connection. In yet another variant, the top plate 729 may be omitted, so that the optical unit 720 bears only on the top surfaces 727 of the posts 744. In this variant as well, the precise, uniform height of the posts provides exact positioning of the optical unit 720.

In the embodiment of FIG. 7, the top surfaces 727 of the engagement posts lie slightly above the top surface of dielectric layer 740. In other variants, the top surfaces of the engagement posts may be flush with the top surface of the dielectric layer or may be recessed below the top surface of the dielectric layer and exposed at the top surface through openings in the dielectric layer. In such an arrangement, the optical unit may be provided with projections which abut the top surfaces of the engagement posts. Also, as discussed below with reference to FIG. 9, the top surfaces of the posts may project above the top surface of the dielectric layer.

In the embodiment of FIG. 7, circuit panel 740 has connection posts 748 which are bonded to contacts 777 on the outer surface of cover 778 in the sensor unit. The connection posts provide electrical connections between the traces (not shown) of the circuit panel 740 and the sensor unit 760. Here again, the process used to bond the connection posts to the contacts should not interfere with engagement between the engagement posts 744 and the engagement surface 778 of the sensor unit. The bond between the connection posts and the contacts helps to hold the engagement posts 744 in abutment with the engagement surface 778. The engagement posts 744 are additionally secured to the sensor unit by an adhesive 755.

The sensor unit 760 has a support structure 779 on a peripheral region of the chip 762 supporting the lid 764, and has a gap 772 between the lid and the chip in other regions, such as in the sensing region 768. As disclosed, for example, in the U.S. Pat. No. 6,040,235 and U.S. patent application Ser. No. 10/949,674, the disclosures of which are incorporated by reference herein, the support structure 779 may include components such as a solid wall, a solidified adhesive and the like, or may be formed integrally with the lid or the chip. Preferably, the engagement posts 744 overlie the support structure 779 and the peripheral region of the chip, rather than the gap 772, so as to enhance structural rigidity between the engagement posts and the chip. The particular sensor unit 760 shown in FIG. 7 has contacts 777 electrically connected to the chip 762 by conductive material in vias 763 extending through the lid 764. However, the features discussed above with reference to FIG. 7 can be used regardless of the particular configuration of the sensor unit.

In another embodiment shown in FIG. 8, an additional external component 851 is arranged on the lower surface of the semiconductor chip 862. Such feature is desirable if the space required in X-Y directions has to be minimized. The external component can be attached to the lower surface of the sensor unit 860, and can be bonded with bonding wires 814 to the circuit panel 840. The external connection panel 880 can also be bonded with bonding wires 810 to the circuit panel 840, by connecting the respective pads 886, 856.

In the embodiment of FIG. 8, wire-bonding is done on only one side of the camera unit 800. In another variant, circuit panel 840 is wire-bonded to the external connection panel 880 on the upper side. The bonding wires 810, 814 can also be encapsulated by an encapsulant (not shown) for protection. The encapsulant could also enclose the area between the circuit panel 840 and the sensor unit 860, at a location of the posts 844, 848. A thermal spreading layer 851 can also be placed between the external device 851 and the semiconductor chip 862. Thermal spreading layer can also be used as an adhesive layer to firmly attach the external device 851 to the chip 862.

A fifth embodiment of the camera unit 900 is depicted in FIG. 9. Upper engagement posts 924 protrude from a top surface of the circuit panel 940. In this embodiment, each engagement post 944 extends entirely through the circuit panel 940, and each engagement post has a top portion 924 defining the top surface 927 of engagement post exposed at the top surface of circuit panel 940. The top portions 924 of the engagement posts project above or forwardly from the dielectric layer of the circuit panel. Stated another way, the top portions 924 thus form top engagement posts. Desirably, each engagement post 944, including its top portion, is an entirely metallic structure. Preferably, all of the engagement posts are formed by a process which provides precise control of post length so that all of the posts have the same length from top surface 927 to bottom surface 946. For example, all of the engagement posts can be formed by etching of a common metallic structure including one or more metal layers. In this embodiment, as in the embodiment discussed above with reference to FIG. 7, the positions of the bottom surfaces 946 relative to the top surfaces 927 are set entirely by the posts themselves. A turret 928 is located on top of the engagement surface 927 of the upper engagement posts 924, and is attached thereto. In the variant shown, the turret is not in contact with the circuit panel 940. Thus, mechanical irregularities of the dielectric layer in circuit panel 940 do not influence the position of the turret 928. Turret 928 can be pre-shaped, for example by molding to fit the portion of the engagement posts 924, or can be directly molded onto the posts 924. In a further variant, the projecting top portions or top engagement posts 924 are offset in the lateral or X-Y directions from posts 944. In such a variant, the number of top engagement posts projecting forwardly from the panel and abutting the optical unit may not be equal to the number of bottom engagement posts projecting rearwardly and engaging the sensor unit. However, in this variant as well, the top engagement posts desirably are connected to the bottom engagement posts in such a way that the top engagement posts are precisely positioned with respect to the bottom engagement posts. For example, the top and bottom engagement posts may be formed as elements of a common metallic structure.

Figure 10A:
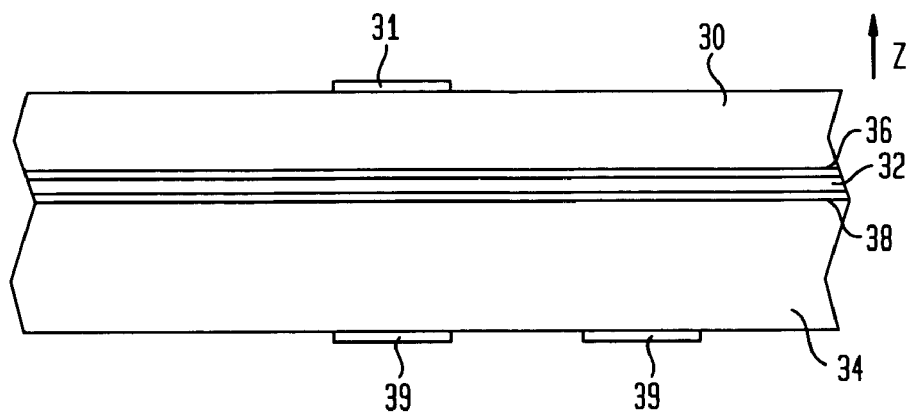
FIGS. 10A-D are sectional views of stages in a method manufacturing the circuit panel as shown in FIG. 9.
Figure 10B:
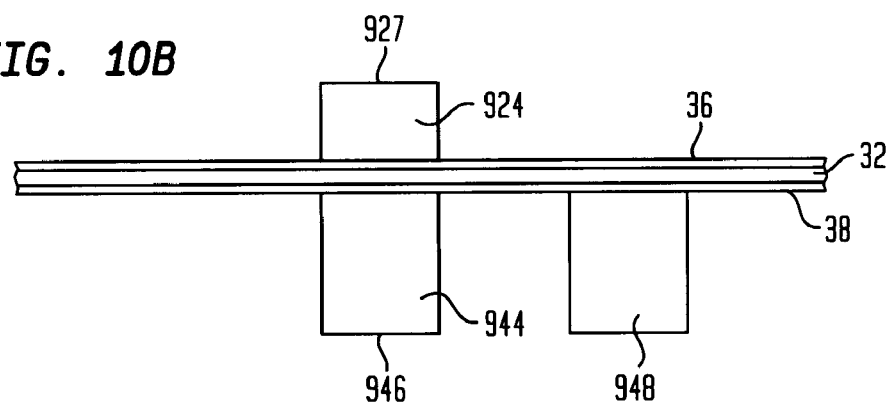
Figure 10C:
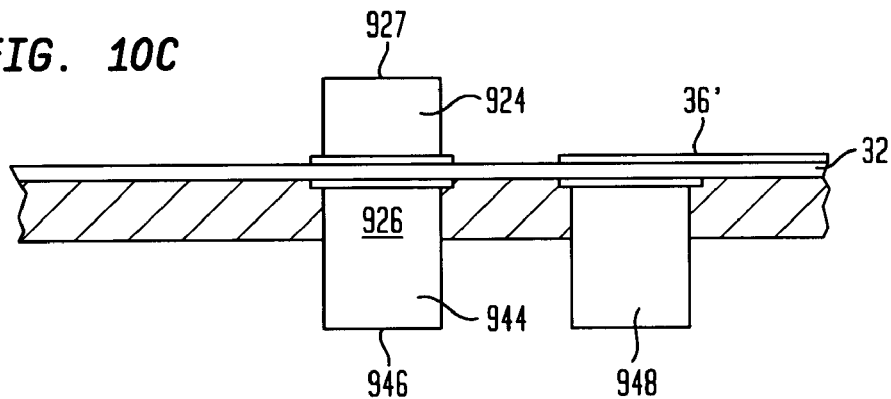
Figure 10D:
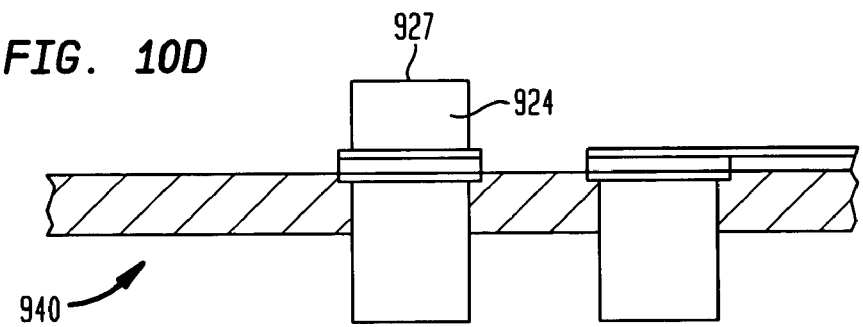

FIGS. 10*a-d* depict the stages of an exemplary method for manufacturing the circuit panel 940. As shown in FIG. 10*a*, a metal sheet used in the process includes a top layer 30, middle layer 32 and bottom layer 34 formed from a readily etchable metal such as copper, and very thin etch-stop layers 36 and 38 formed from a different metal such as nickel at the interfaces between the etchable layers. The top and bottom layers are selectively masked by masks 31, 39 and etched from both sides (FIG. 10*b*) to leave posts 944, 948, and 924 projecting from the middle layer 32 at the locations where the posts are to be formed. The posts 944, 948, and 924, together with the intervening portions portion of middle layer 32, constitute the connection structure which mechanically and electrically connects the sensor unit 960 with the circuit panel 940. The etch stop layer 38 (FIG. 10*a*) is then removed from the bottom surface of the middle layer 32, whereas the etch stop layer 36 is selectively removed so as to leave protective portions 36' in areas where traces are to be formed (FIG. 10*c*). The bottom surface of middle layer 32 is covered with a dielectric as, for example, by spin-coating using a flowable dielectric material such as an uncured polyimide to form the dielectric layer 910 (FIG. 10*c*). The middle layer 36 is then etched to form traces 912. In the variant shown, the traces 912 are electrically connected to the electrical connection posts 948, but not to the bottom mechanical engagement posts 944 and the upper engagement posts 924. Additional selective masking and etching processes can adapt the length of the electrical connection posts, if such feature is desired (as shown in FIG. 9).

The foregoing process of making the circuit panel 140 is merely exemplary; any suitable process can be employed. For example, where the posts are to be disposed only on the bottom surface of the dielectric layer (for example, in the first embodiment shown in FIG. 1), the initial metal sheet may include only two etchable layers; the top layer 30 may be omitted.

Multiple circuit panels can be manufactured by printed circuit board manufacturing techniques thereby forming tape 940, and in a later step can be cut out into individual circuit panels.

Figure 11:
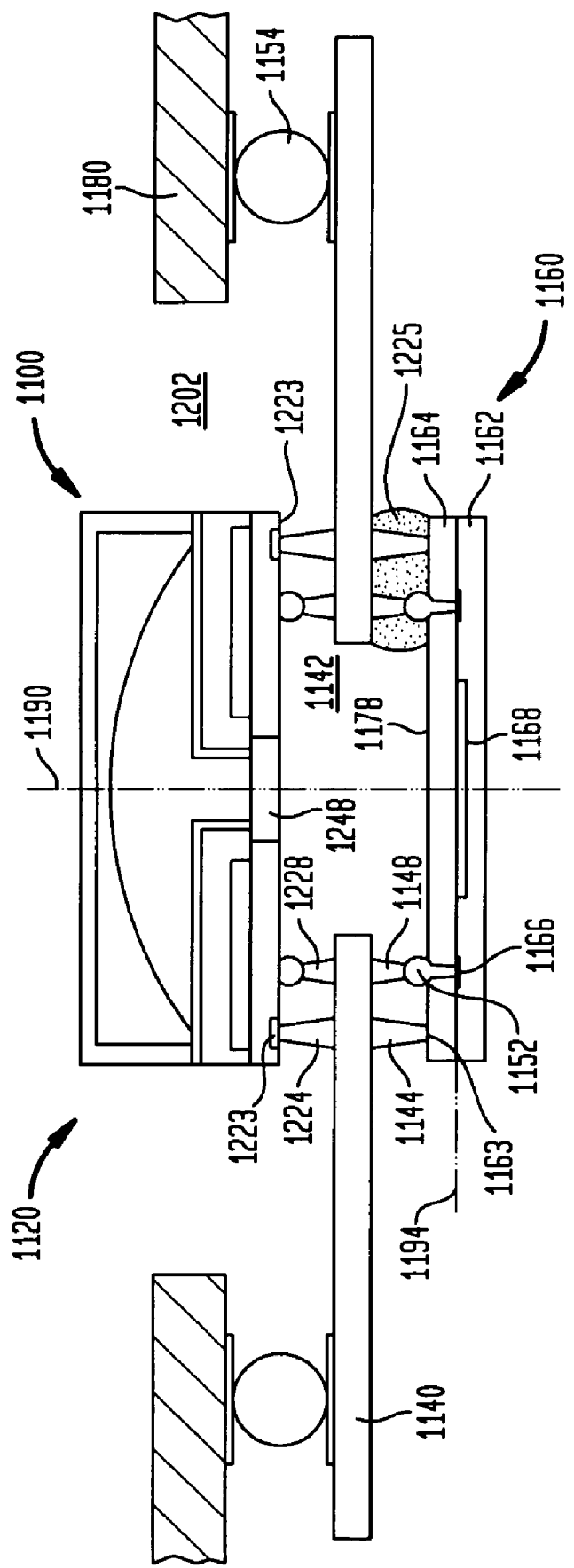
FIG. 11 is a sectional view according to a sixth embodiment of the present invention using liquid lens technology.

A camera module 1100 according to a further embodiment, shown in FIG. 11, includes a sensor unit 1160 and circuit panel 1140 similar to those discussed above. In this embodiment, however, the optical unit 1120 is includes electrical components. Merely by way of example, the optical unit may incorporate an electrically-operated variable focus lens, such as a variable-focus liquid lens as described, for example, in U.S. Published Patent Application Nos. 20050113912 and 20060028734, and in Stein Kuiper & Benno Hendriks, "Wet & Wild—Liquid Lenses Provide Quality Images For Camera Phones," SPIE's oemagazine, Jan. 2005, or as disclosed in co-pending, commonly-assigned U.S. patent application Ser. Nos. 11/318,821 and 11/318,874, the disclosures of said '821 and '874 applications being incorporated by reference herein. Other examples of optical units which include electrical components include those with electronic or electromechanical shutters, mirrors, variable apertures and the like. In this embodiment as well, the optical unit is positioned with respect to the circuit panel and, in particular, with respect to the sensor unit, by metallic elements such as top engagement posts 1224. In this embodiment as well, the top engagement posts may be formed integrally with the bottom engagement posts 1144 which position the sensor unit, so that the location of the optical unit with respect to the sensor unit in the Z direction along the optical axis depends only on the metallic structure, and not on the dielectric element of the circuit panel. In the embodiment depicted in FIG. 11, the top engagement posts engage laterally-facing surfaces of the optical unit within recesses 1223, and the bottom engagement posts 1144 likewise engage laterally-facing surfaces of the sensor unit within recesses 1163 on the optical unit, so that the position of the optical unit with respect to the sensor unit in the lateral or X-Y directions also is set only by the engagement posts. Any of the other arrangements of elements discussed above with respect to the sensor unit can be used for mounting the optical unit as well. The optical unit in this embodiment is electrically connected to conductors (not shown) of circuit panel 1140 by top connection posts 1228, similar to the connection posts discussed above. Thus, optical unit 1120 is connected to the main or external circuit panel 1180 by some of the connecting units or solder balls 1154 which connect panel 1140 with panel 1180. The top connection posts may be electrically isolated from the bottom connection posts 1148 which provide electrical connection to the sensor unit 1160. Alternatively, some or all of the top and bottom connection posts may electrically connect the optical unit with the sensor unit. In other variants, the optical unit may be electrically connected to the circuit panel 1140 of the camera module, to main or external circuit panel 1180, or both, by other electrically conductive elements such as wire bonds. An encapsulant 1225 may be provided around the structure to act as a barrier the entry of dust and other contaminants between the optical unit and sensor unit. The encapsulant may also act as a barrier to entry of stray light.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A camera module including:
   (a) a circuit panel having a top side, a bottom side and transparent region, said circuit panel having conductors;
   (b) a sensor unit disposed on the bottom side of said circuit panel, said sensor unit including a semiconductor chip having a front surface including an imaging area facing in a forward direction in alignment with said transparent region and an imaging circuit adapted to generate signals representative of an optical image impinging on said imaging area;
   (c) posts protruding from the bottom side of the circuit panel, at least some of said posts being engagement posts having bottom surfaces, at least some of the bottom surfaces abutting an engagement surface of the sensor unit.

2. The camera module according to claim 1 wherein said engagement posts have top surfaces exposed at the top surface of said circuit panel.

3. The camera module according to claim 2 wherein said engagement posts project forwardly from the top surface of the panel so that the top surfaces of the engagement posts are disposed forward of the panel.

4. The camera module according to claim 2 wherein the top surfaces of the engagement posts are recessed rearwardly from the top surface of the circuit panel.

5. The camera module according to claim 2 wherein the engagement posts are formed from a common metallic plate.

6. The camera module according to claim 2, further comprising an optical unit including one or more optical elements, said optical unit abutting said top surfaces of said engagement posts.

7. The camera module according to claim 2 further comprising a top plate extending between at least some of said engagement posts, said at least some of said engagement posts and said top plate constituting a unitary metallic body.

8. The camera module according to claim 7 wherein said top plate defines a bearing surface exposed at the top surface of the circuit panel.

9. The camera module according to claim 8 wherein said bearing surface is coplanar with the top surfaces of said at least some of said engagement posts.

10. The camera module according to claim 8, further comprising an optical unit including one or more optical elements, said optical unit abutting against said bearing surface.

11. The camera module according to claim 1, wherein said sensor unit also includes a cover having a transparent area aligned with said imaging area, said cover overlying said front surface and being secured to said chip, said cover having an outer surface facing away from said chip and toward said bottom surface of said circuit panel.

12. The camera module according to claim 11, wherein the engagement surface of the sensor unit includes the outer surface of the cover.

13. The camera module according to claim 11, wherein the cover includes one or more recesses in the outer surface, and the engagement surface of the sensor unit includes surfaces within said one or more recesses.

14. The camera module according to claim 13 wherein said recesses have bottom surfaces facing forwardly and the engagement surface includes the bottom surfaces.

15. The camera module as claimed in claim 1 wherein said posts have side surfaces facing in lateral directions transverse to the forward direction and at least one of the side surfaces abuts a surface of the sensor unit.

16. The camera module as claimed in claim 15 wherein the sensor unit includes a cover having a transparent area aligned with said imaging area, said cover overlying said front surface and being secured to said chip, the cover having at least one laterally-facing surface abutting at least one of said side surfaces.

17. The camera module as claimed in claim 16 wherein the cover has an outer surface facing away from the chip and recesses extending into the cover from the outer surface, the recesses having wall surfaces, said at least one laterally-facing surface including at least one of said wall surfaces.

18. The camera module as claimed in claim 16 wherein the cover has an outer surface facing away from the chip and edge surfaces bounding the outer surface, said at least one laterally-facing surface of the cover including at least one of said edge surfaces.

19. The camera module as claimed in claim 15 wherein said at least one of said side surfaces includes at least one side surface of at least one of said engagement posts.

20. The camera module according to claim 1, wherein at least some of said posts are connection posts and said connection posts electrically connect said imaging circuit of said sensor unit with at least some of said conductors of said circuit panel.

21. The camera module according to claim 20, wherein said sensor unit the sensor unit includes a cover having a transparent area aligned with said imaging area, said cover overlying said front surface and being secured to said chip, the cover having an outer surface, the sensor unit further including contacts exposed at said outer surface of said cover, said contacts being electrically connected to said imaging circuit of said chip, said contacts being electrically connected to said conductors on said circuit panel by said connection posts.

22. The camera module according to claim 21, wherein said connection posts are solder-bonded to said contacts.

23. The camera module as claimed in claim 21, wherein said connection posts being shorter that said engagement posts.

24. The camera module according to claim 1, further comprising an optical unit including one or more optical elements, said optical unit projecting from said top side of said circuit panel.

25. The camera module according to claim 24 wherein said circuit panel includes an engagement region, at least some of said engagement posts project rearwardly from said engagement region, and said optical module is supported on the top surface of the circuit panel in said engagement region.

26. The camera module according to claim 25, wherein said transparent region of said circuit panel includes a hole extending through said circuit panel and said engagement region surrounds said hole.

27. The camera module according to claim 24, wherein said optical unit includes a turret supporting said optical elements.

28. The camera module according to claim 24, wherein said optical elements include at least one lens positioned forwardly of said circuit panel.

29. The camera module according to claim 1 wherein said sensor unit includes a cover having a transparent area aligned with said imaging area, said cover overlying said front surface and a support structure supporting said cover on the chip so that said cover and said chip define a gap between said cover and said chip aligned with said imaging area, said engagement pins being engaged with a portion of said engagement surface aligned with said support structure.

* * * * *

UNITED STATES PATENT AND TRADEMARK OFFICE
CERTIFICATE OF CORRECTION

PATENT NO.       : 7,593,636 B2                                              Page 1 of 1
APPLICATION NO.  : 12/004149
DATED            : September 22, 2009
INVENTOR(S)      : Michael J. Nystrom et al.

It is certified that error appears in the above-identified patent and that said Letters Patent is hereby corrected as shown below:

On the title page item
    (57) ABSTRACT, line 4 after "Includes" insert --a--.

Column 2, line 60 "were" should read --where--.
  Column 3, line 35 before "FIG. 1" delete "The".
  Column 4, line 11 after "162" insert --is--.
  Column 4, line 24 "180." should read --180).--.
  Column 6, line 23 "are" should read --area--.
  Column 6, line 58 "attach the turret" should read --the turret is attached--.
  Column 7, line 56 after "in" insert --a--.
  Column 8, line 14 "are" should read --is--.
  Column 9, line 52 after "posts" delete ",".
  Column 10, line 2 after "760" delete ",".
  Column 12, line 33 after "1120" delete "is".
  Column 13, line 13 after "barrier" insert --to--.
  Column 14, line 50 after "said sensor unit" delete "the sensor unit".
  Column 14, line 62 "being" should read --are--.
  Column 14, line 62 "that" should read --than--.

Signed and Sealed this
Twenty-eighth Day of December, 2010

David J. Kappos
*Director of the United States Patent and Trademark Office*